United States Patent
Wong et al.

(10) Patent No.: US 6,223,973 B1
(45) Date of Patent: May 1, 2001

(54) APPARATUS AND METHOD FOR CONNECTING PRINTED CIRCUIT BOARDS THROUGH SOLDERED LAP JOINTS

(75) Inventors: Stephen H. P. Wong; Billy Kiang, both of Markham (CA)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/441,334

(22) Filed: Nov. 16, 1999

(51) Int. Cl.[7] .................. H05K 3/34; B23K 31/00; B23K 31/02
(52) U.S. Cl. .............. 228/180.1; 228/179.1; 228/39; 29/840; 361/803
(58) Field of Search .............. 228/180.1, 179.1, 228/39, 37; 29/840; 361/803, 804

(56) References Cited

U.S. PATENT DOCUMENTS

| | | |
|---|---|---|
| 4,491,562 | 1/1985 | Soga et al. . |
| 4,526,313 | 7/1985 | Hug et al. . |
| 4,589,584 | 5/1986 | Christiansen et al. . |
| 4,708,281 * | 11/1987 | Nelson et al. .................. 228/180.1 |
| 4,717,064 * | 1/1988 | Popielarski et al. ................ 228/39 |
| 4,834,660 * | 5/1989 | Cotti ................................. 439/67 |
| 4,897,918 * | 2/1990 | Osaka et al. ........................ 29/830 |
| 4,981,248 * | 1/1991 | Hall ...................................... 228/8 |
| 5,128,506 * | 7/1992 | Dahne et al. .................... 219/85.13 |
| 5,227,589 * | 7/1993 | Weeks ............................... 174/263 |
| 5,364,011 | 11/1994 | Baker et al. . |
| 5,418,691 * | 5/1995 | Tokura ............................... 361/803 |
| 5,479,320 * | 12/1995 | Estes et al. ....................... 361/785 |
| 5,533,904 * | 7/1996 | Nobel et al. ........................ 439/67 |
| 5,604,333 * | 2/1997 | Kennish et al. .................. 174/261 |
| 5,609,490 * | 3/1997 | Beesch et al. ..................... 439/79 |
| 5,617,990 * | 4/1997 | Thompson, Sr. ................ 228/180.1 |
| 5,644,475 * | 7/1997 | Woychik et al. ................. 361/767 |
| 5,679,155 * | 10/1997 | Velie ............................... 118/110.1 |
| 5,704,535 * | 1/1998 | Thompson, Sr. .................... 228/39 |
| 5,727,727 * | 3/1998 | Ead ................................ 228/123.1 |
| 5,777,855 * | 7/1998 | Yokajty ............................ 361/803 |
| 5,820,013 | 10/1998 | Ortiz . |
| 5,825,633 * | 10/1998 | Bujalski et al. ................... 361/804 |
| 5,982,626 * | 11/1999 | Kodama ........................... 361/749 |
| 6,071,597 * | 6/2000 | Yang et al. ....................... 428/209 |

* cited by examiner

*Primary Examiner*—Patrick Ryan
*Assistant Examiner*—L. Edmondson
(74) *Attorney, Agent, or Firm*—John R. Kajander

(57) ABSTRACT

An apparatus and method for connecting together first and second printed circuit boards 10/20 (PCBs), wherein one or both of the PCBs is a flex circuit. The method includes overlapping the two PCBs such that their respective matching circuit trace arrays 12/22 face each other and are separated by a small predetermined distance K, and then introducing molten solder 30 proximate an overlapping PCB edge 18, such as by wave soldering, so as to urge capillation of the molten solder between the two PCBs, thereby forming solder joints operatively connecting together the two circuit trace arrays.

22 Claims, 3 Drawing Sheets

Direction of Travel
Through Solder Wave

APPARATUS AND METHOD FOR CONNECTING PRINTED CIRCUIT BOARDS THROUGH SOLDERED LAP JOINTS

BACKGROUND OF THE INVENTION

1. Field of the Invention

The present invention relates generally to printed circuit boards, and more particularly to approaches for connecting one printed circuit board to another.

2. Disclosure Information

Printed circuit boards (PCBs) are available in a variety of different types. Some PCBs are rigid, such as those having a substrate made of alumina or FR-4 glass/epoxy laminate, while others are relatively flexible (i.e., "flex circuits"), such as those having a substrate made of polyimide, polyester, and the like. Sometimes it is necessary to connect one PCB to another; that is, to electrically connect the circuit traces of a first PCB to corresponding circuit traces on second PCB. This board-to-board connection can be made either directly or indirectly. Indirect connection is the more common approach, which utilizes one or more connectors as an intermediary between the two boards. For example, as illustrated in FIG. 1, one board 10 might have a through-hole type connector 90 with male pins 92 thereon, while the other board 20 might have a surface mount type connector 94 with female receiving sockets 96 therein. The connectors 90/94 not only electrically connect the respective traces 14/24 together, but also acts as a mechanical strain relief against shear or flexure of one board with respect to the other. On the other hand, direct connection approaches do not rely on an intermediate connector, and are usually limited to cases where one or both of the boards is a flex circuit. (Directly connecting two rigid boards together without an intermediate connector is typically not practical, because the solder joints between the boards' adjoined traces cannot withstand much shear or flexure of one board with respect to the other.)

The typical direct connection approach for connecting a first (flex circuit) PCB to a second (flex or rigid) PCB involves the steps of (1) arranging the respective traces in correspondingly matching arrays at the edge of each board, (2) applying solder paste, conductive adhesive, or the like to the ends of the traces where connection is to occur, (3) overlapping the edges of the PCBs and placing the respective trace arrays in direct contact with one another, (4) applying pressure and heat through a mandrel or hot bar to the overlapped area so as to melt the solder paste, and (5) removing the heat and pressure so as to form solid solder joints connecting each trace of the first PCB with its counterpart trace on the other PCB. This is known as the "hot bar solder reflow" process. In order to effectively reflow the solder, the temperature of the hot bar or mandrel is typically maintained at about 280–300° C.

When the more expensive polyimide is used as the flex circuit substrate material, the hot bar process may be used, since the glass transition temperature of polyimide is typically about 350° C. However, when the less expensive polyester material is used as the substrate, hot bar processing cannot be used, since the glass transition temperature of polyester is about 70° C. In fact, use of the hot bar process would melt, distort, and severely damage a flex circuit having a substrate made of polyester. Thus, hot bar and other direct connection processes typically cannot be used with polyester flex substrates, thus requiring the use of connectors and an indirect connection approach. This presents a dilemma, because although polyester is more attractive than polyimide from a materials cost standpoint, the cost of the connectors and associated processing often offsets much of the savings that polyester seems to provide in the first place. It would be desirable, therefore, to provide an alternative to hot bar processing which permits direct, connectorless connection between one or more flex circuits made of polyester substrate.

SUMMARY OF THE INVENTION

The present invention overcomes the disadvantages of the prior art approaches by providing an apparatus and method for connecting together first and second PCBs, wherein the first PCB has a first plurality of circuit traces arranged on a first surface thereof and terminating proximate a first edge thereof, and wherein the second PCB has a second plurality of circuit traces corresponding to the first plurality of circuit traces and arranged on a second surface thereof. The method includes the steps of: (a) arranging the first and second PCBs with the first edge of the first PCB overlapping the second PCB, such that the first and second pluralities of circuit traces are matchingly facing each other and are separated from one another by a predetermined spacing K; (b) shielding the first and second PCBs with a non-solder-wettable shield having an aperture therethrough, such that substantially only the first edge and portions of the first and second PCBs immediately adjacent the first edge are exposed through the aperture; (c) introducing molten solder through the aperture proximate the first edge of the first PCB, so as to urge capillation of the molten solder between the first and second boards; and (d) allowing the molten solder to cool so as to form a plurality of solid solder joints each connecting a respective one of the first plurality of circuit traces with a corresponding one of the second plurality of circuit traces.

It is an object and advantage that the method and apparatus of the present invention may be used to solder together two or more PCBs, wherein at least one of the PCBs is a flex circuit.

Another advantage is that the method and apparatus of the present invention may be used successfully with PCBs having substrates made of lower melting point materials, such as polyester, without damaging the substrate the way hot bar soldering and other prior art approaches can.

These and other advantages, features and objects of the invention will become apparent from the drawings, detailed description and claims which follow.

DETAILED DESCRIPTION OF THE PREFERRED EMBODIMENTS

Figure 1:
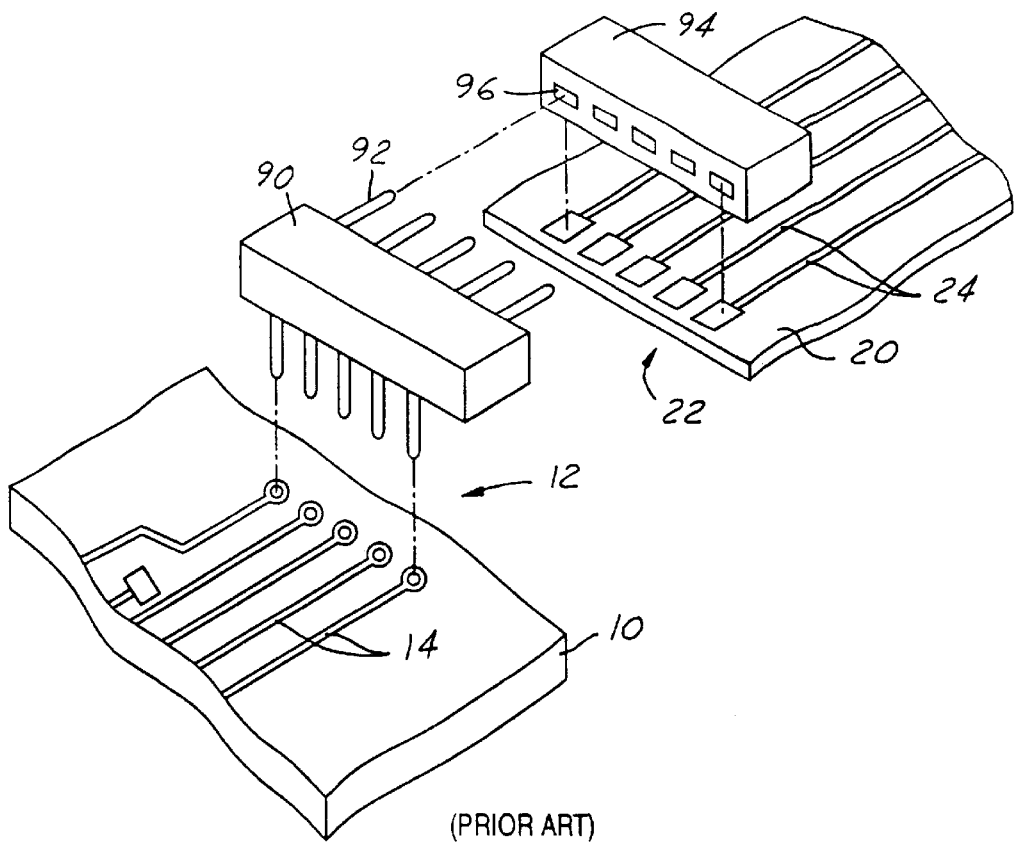
FIG. 1 is an exploded perspective view of a flex PCB and an FR-4 PCB that are connectable together using connectors according to the prior art.

Referring now to the drawings, FIGS. 2–9 illustrate an apparatus and method for connecting together first and second PCBs according to the present invention. The first PCB 10 has a first plurality 12 of circuit traces 14 arranged on a first surface 16 thereof and terminating proximate a first edge 18 thereof, and the second PCB 20 has a second plurality 22 of circuit traces 24 corresponding to the first plurality of circuit traces and arranged on a second surface 26 thereof. Preferably, the two circuit trace arrays 12/22 should substantially match each other in the number, size, and spacing, and arrangement of their respective individual traces 14/24, in the respective regions where joining is to occur between the two arrays 12/22. Said another way, the only similarity required between the circuit trace arrangements of the two PCBs 10/20 is in the respective regions where the two PCBs are to be joined according to the present invention.

Figure 2:
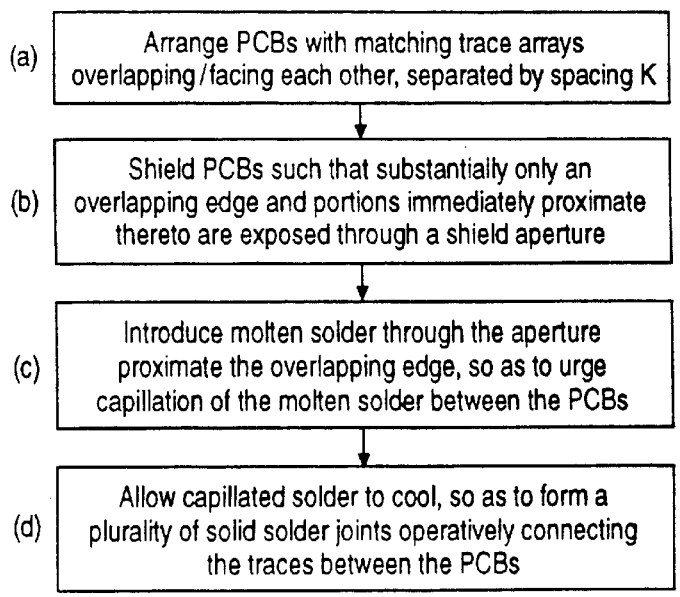
FIG. 2 is a flowchart illustrating the method of the present invention.
Figure 3:
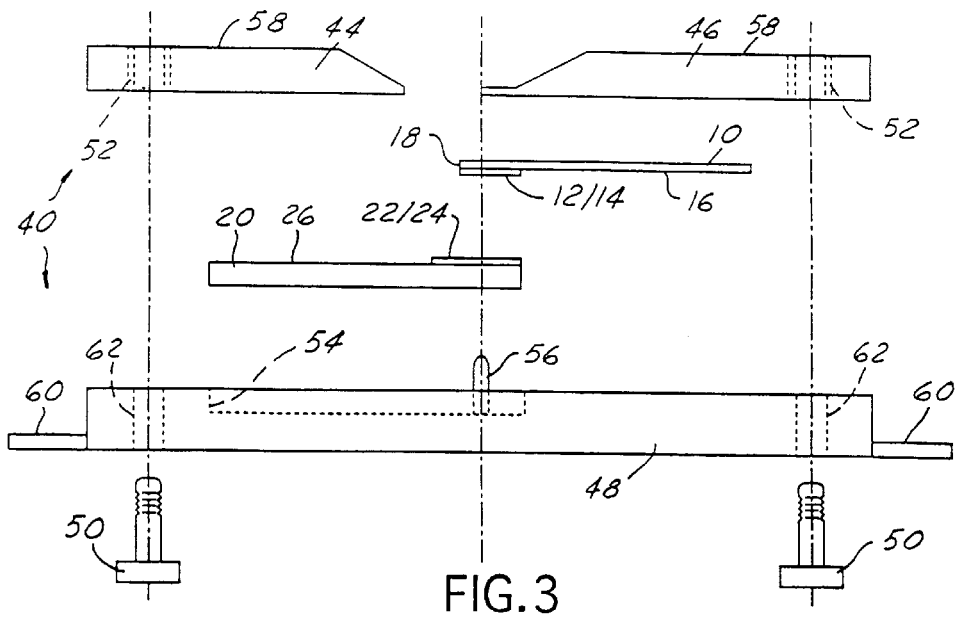
FIGS. 3–4 are exploded and assembled side views, respectively, of an apparatus according to the present invention for soldering together two or more PCBs.

To assist the reader in understanding the present invention, all reference numbers used herein are summarized in the table below, along with the elements they represent:

10=First PCB
12=First plurality/array of circuit traces
14=Individual circuit trace of first trace array
16=First surface of first PCB
18=First edge of first PCB
20=Second PCB
22=Second plurality/array of circuit traces
24=Individual circuit trace of second trace array
26=Second surface of second PCB
28=Non-overlapped, solder mask-free portion of circuit trace 24
30=Molten solder
40=Shield
42=Aperture in shield
44=Bottom plate of shield
46=Bottom plate of shield
48=Carrier plate of shield
50=Thumbscrew
52=Threaded hole in bottom plate
54=Pocket/recess in carrier plate
56=Alignment pin in carrier plate
58=Bottom surface of bottom plates
60=Flanges extending outward from carrier plate
62=Through hole in carrier plate
70=Solder mask
72=Edge of solder mask
80=Solder connection region between trace arrays
90=Connector (through-hole)
92=Male pins on connector 90
94=Connector (surface mount)
96=Female receiving sockets in connector 94
K=Predetermined spacing between trace arrays
M=Maximum upper limit of K The method of the present invention is illustrated in FIG. 2, and includes the steps of: (a) arranging the first and second PCBs 10/20 with the first edge 18 of the first PCB 10 overlapping the second PCB 20, such that the first and second pluralities 12/22 of circuit traces are matchingly facing each other and are separated from one another by a predetermined spacing K; (b) shielding the first and second PCBs with a non-solder-wettable shield 40 having an aperture 42 therethrough, such that substantially only the first edge and portions of the first and second PCBs immediately adjacent the first edge are exposed through the aperture; (c) introducing molten solder 30 through the aperture 42 proximate the first edge 18 of the first PCB, so as to urge capillation of the molten solder between the first and second boards; and (d) allowing the molten solder to cool so as to form a plurality of solid solder joints each connecting a respective one of the first plurality of circuit traces with a corresponding one of the second plurality of circuit traces. An optional step of applying flux to at least one of the first and second circuit trace arrays 12/22 may be performed before step (c).

The step of introducing molten solder 30 (i.e., step (c)) may be carried out by various processes, such as molten solder dispense (e.g., see U.S. Pat. No. 5,364,011), but the preferred approach is to utilize wave soldering. By utilizing an apparatus such as the shield 40 described below, a conventional wave soldering process may be utilized to connect together two or more PCBs 10/20 according to the method of the present invention wherein at least one of the PCBs is a flex circuit.

The method of the present invention preferably also includes the step of restraining the first and second PCBs 10/20 during at least step (c) so as to prevent the predetermined spacing K from exceeding a maximum upper limit M during step (c), while at the same time allowing the predetermined spacing K to be greater than 0 mm during step (c). In other words, the trace arrays 12/22 of the two PCBs may be placed in substantial contact with each other initially (i.e., K is at or slightly above 0 mm), preferably without any preload or any other pressure pressing the two arrays together, but a fixture or apparatus should be used to assure that the spacing K between the two arrays does not exceed the maximum upper limit M during the introduction of the molten solder. A recommended range for K is $0 \text{ mm} \leq K \leq 1.5$ mm, with a range of $0 \text{ mm} \leq K \leq 0.5$ mm being more preferred, in order to assure capillation of the molten solder along the traces 14/24 between the two arrays 12/22. (Said another way, a recommended maximum upper limit M for the spacing K would be M=1.5 mm, or more preferably M=0.5 mm.)

Figure 4:
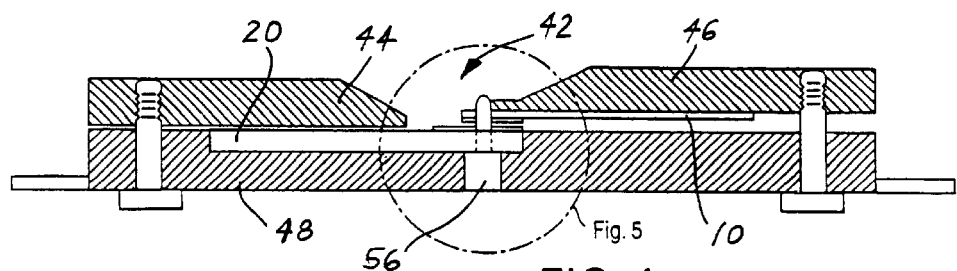
Figure 5:
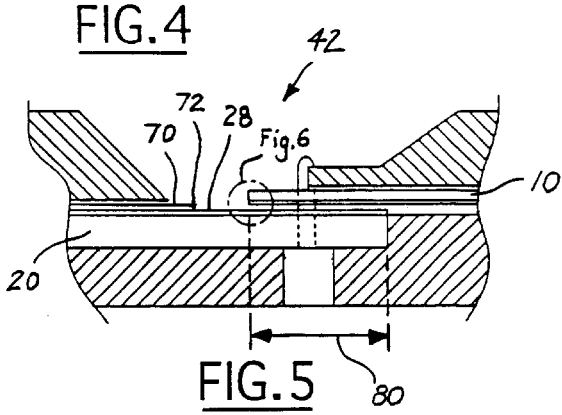
FIG. 5 is an enlarged view of the region indicated in FIG. 4.
Figure 9:
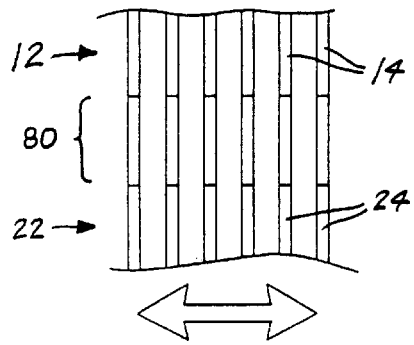
FIG. 9 is a schematic view of the overlapped circuit traces, indicating a recommended direction of travel of the PCBs through a wave soldering machine.
Figure 6:
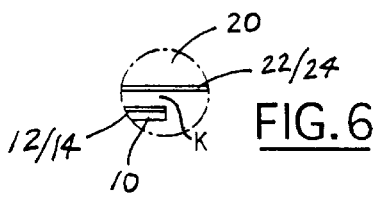
FIG. 6 is an enlarged view of the region indicated in FIG. 5.

As with conventional PCB construction, the circuit traces 14/24 of both PCBs 10/20 should be covered with a solder mask 70 to protect the traces, except where connections are to occur between the traces and other components (e.g., active and passive electronic devices, jumper wires, connectors, etc.), such as at mounting pads, selected trace terminations, and the like. It is recommended, of course, that the aforementioned trace arrays 12/22 have no solder mask 70 on them where the two arrays 12/22 are designed to overlap each other and where a solder connection therebetween is desired (i.e., in region 80, as shown in FIGS. 4–5). It is also recommended that each one 24 of the second plurality of circuit traces have an additional or further solder-mask-free portion 28 thereof which is immediately proximate the connection region/first edge 80/18 and which is not overlapped by the first PCB/first edge when the two boards are aligned in step (b), as illustrated in FIGS. 4–5. With the solder mask edge 72 on the second PCB 20 being "pulled back" away from the first edge 18 as shown, when the molten solder 30 is introduced into the shield aperture 42, the solder 30 will wet onto the solder-mask-free portion 28 of each trace 24 and will then wick or capillate between the spaced-apart overlapping trace arrays 12/22 along the overlapped length of the exposed traces 14/24 and form solid solder joints thereat.

Figure 7:
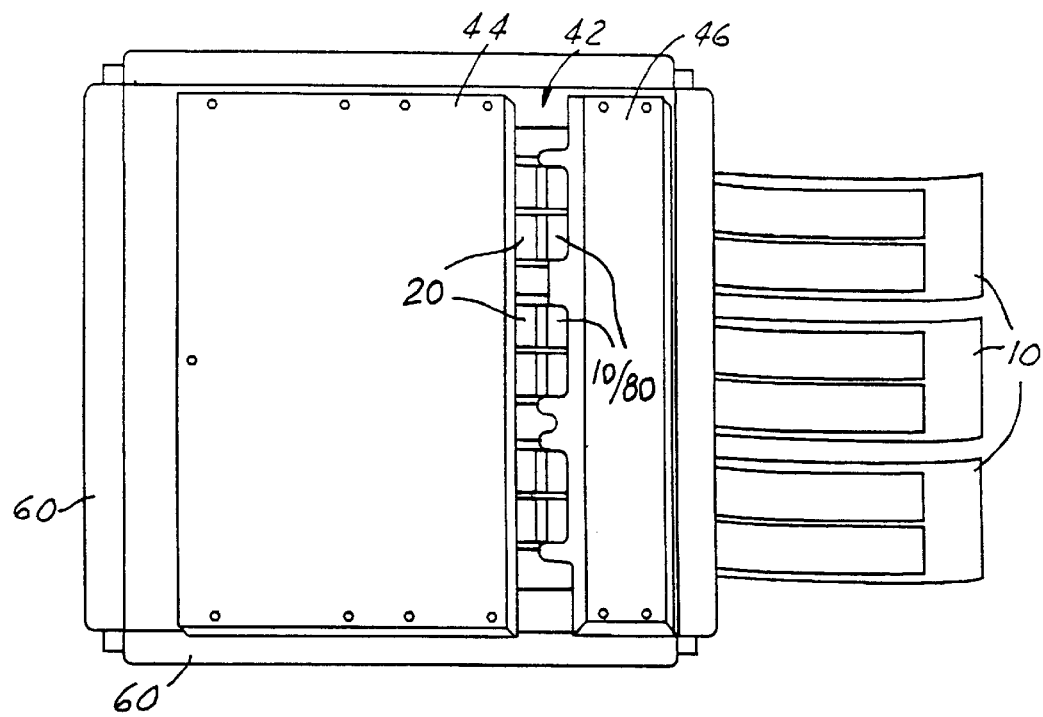
FIGS. 7–8 are bottom and top views, respectively, of an apparatus for wave soldering three sets of first and second PCBs according to the present invention.
Figure 8:
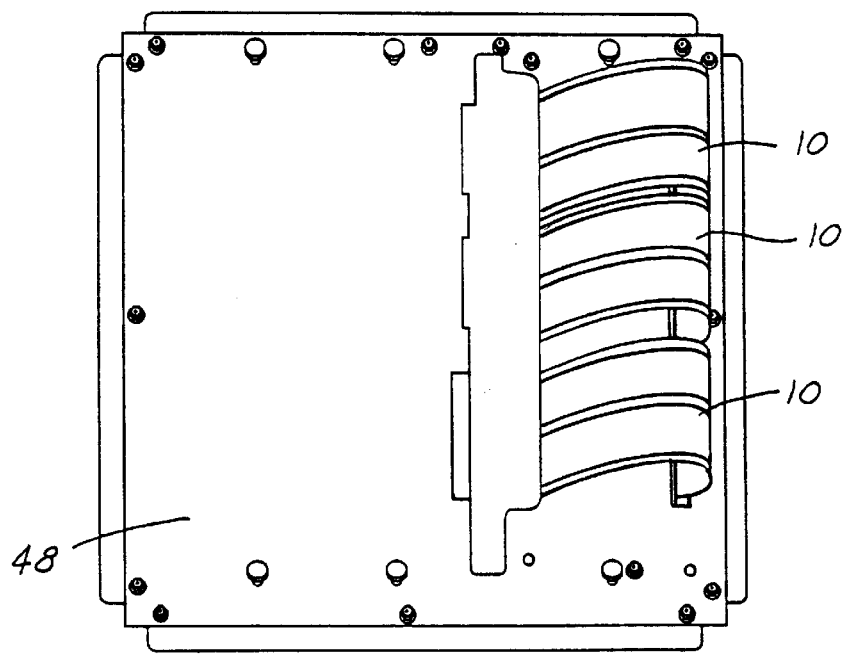

The aforementioned shield 40 may be designed in a variety of ways, such as shown in FIGS. 3–8. Here, the shield 40 comprises two bottom plates 44/46 which are removably fastened to a carrier plate 48 by fastening means such as the thumbscrews 50, through holes 62, and threaded holes 52 shown in FIG. 3. The carrier plate 48 (and/or the bottom plates 44/46) may have a pocket 54 defined therein for receiving one or more of the PCBs 10/20, as well as one or more alignment pins 56. The pocket 54 and/or alignment pins 56 serve to removably and alignedly hold the overlapped PCBs in place. Once the PCBs are fitted into the pocket 54 and/or onto the alignment pins 56, the bottom plates 44/46 may be fastened down onto the carrier plate 48. The assembly may then be flipped over, as shown in FIG. 4, and the assembly may be placed into a wave soldering machine wherein the flange portions 60 extending from the carrier plate 48 may be situated onto the wave soldering machine conveyor, for transporting the assembly through the machine's molten solder zone(s). FIGS. 7–8 illustrate the assembly from top and bottom perspectives, and show the direction of travel through the molten solder bath as indicated. For wave soldering, it is recommended that the direction of travel be perpendicular to the length direction of the overlapped traces 14/24, as shown schematically in FIG. 9, so that each of the solid solder joints is non-contiguous (i.e., non-bridging) with each adjacent one of the solid solder joints. Also, it is recommended that not only should the "bottom" surface 58 of the bottom plates 44/46 be non-solder-wettable, but preferably the carrier plate 48 as well. This can be accomplished by fabricating the various plates 44/46/48 from a polymeric material, such as FR-4 epoxy.

As mentioned above, substantially only the first edge 18 and those portions of the PCBs immediately adjacent the first edge should be exposed through the aperture 42 in the shield. These are the only portions of the PCBs that should be exposed through the aperture 42; however, there may be other non-PCB structures that may be exposed through the aperture 42. The reason for minimizing exposure of the PCBs through the aperture 42 is to protect the PCB substrates from the hot molten solder. This is especially important when one or more PCBs has a polyester flex substrate or other substrate that is sensitive to the elevated temperature of molten solder.

Various other modifications to the present invention may occur to those skilled in the art to which the present invention pertains. For example, the first edge 18 of the first PCB 10 may overlap the second PCB 20 at an edge of the second PCB, or at an "interior" region of the second PCB non-proximate to any second PCB edge. Also, while repeated reference has been made to the joining of only two PCBs in the foregoing description, it should apparent that more than two PCBs may be joined together using the present invention. Additionally, the "circuit boards" or "PCBs" described herein are not limited to component-populated boards, but also include non-populated circuit traced substrates of all types. Other modifications not explicitly mentioned herein are also possible and within the scope of the present invention. It is the following claims, including all equivalents, which define the scope of the present invention.

What is claimed is:

1. A method for connecting together first and second printed circuit boards, wherein the first printed circuit board has a first plurality of circuit traces arranged on a first surface thereof and terminating proximate a first edge thereof, and wherein the second printed circuit board has a second plurality of circuit traces corresponding to the first plurality of circuit traces and arranged on a second surface thereof, said method comprising the steps of:

(a) arranging the first and second printed circuit boards with the first edge of the first printed circuit board overlapping the second printed circuit board, such that the first and second pluralities of circuit traces are matchingly facing each other and are separated from one another by a predetermined spacing K;

(b) shielding the first and second printed circuit boards with a non-solder-wettable shield having an aperture therethrough, such that substantially only the first edge and portions of the first and second circuit boards immediately adjacent the first edge are exposed through the aperture; and (c) introducing molten solder through the aperture proximate the first edge of the first printed circuit board, so as to urge capillation of the molten solder between the first and second printed circuit boards.

2. A method according to claim 1, further comprising the step of:

(d) allowing the molten solder to cool so as to form a plurality of solid solder joints each connecting a respective one of the first plurality of circuit traces with a corresponding one of the second plurality of circuit traces.

3. A method according to claim 1, further comprising the step of applying flux to at least one of the first and second pluralities of circuit traces before said step (c).

4. A method according to claim 1, further comprising the step of restraining the first and second printed circuit boards during at least said step (c) so as to prevent the predetermined spacing K from exceeding 0.5 mm during said step (c), while allowing the predetermined spacing K to be greater than 0 mm during said step (c).

5. A method according to claim 1, wherein in said step (a) each of the second plurality of circuit traces has a solder-mask-free portion thereof that is immediately proximate the first edge and is not overlapped by the first printed circuit board.

6. A method according to claim 1, wherein said step (c) of introducing molten solder is carried out by wave soldering.

7. A method according to claim 1, wherein said step (c) of introducing molten solder is carried out by molten solder dispensing.

8. A method according to claim 1, wherein the first and second printed circuit boards are flex circuits.

9. A method according to claim 8, wherein each flex circuit includes a polyester substrate.

10. A method according to claim 1, wherein the first printed circuit board is a flex circuit and the second printed circuit board is substantially rigid.

11. A method according to claim 10, wherein the flex circuit includes a polyester substrate.

12. A method according to claim 1, wherein 0 mm$\leq$K$\leq$1.5 mm.

13. A method according to claim 1, wherein 0 mm$\leq$K$\leq$0.5 mm.

14. A method according to claim 2, wherein each of the solid solder joints is non-contiguous with each adjacent one of the solid solder joints.

15. A method for connecting together first and second printed circuit boards, wherein the first printed circuit board has a first plurality of circuit traces arranged on a first surface thereof and terminating proximate a first edge thereof, and wherein the second printed circuit board has a second plurality of circuit traces corresponding to the first plurality of circuit traces and arranged on a second surface thereof, said method comprising the steps of:

(a) arranging the first and second printed circuit boards generally parallel with one another with the first edge of the first printed circuit board overlapping the second printed circuit board, such that the first and second pluralities of circuit traces are matchingly facing each other and are separated from one another by a predetermined spacing K, wherein 0 mm$\leq$K$\leq$0.5 mm;

(b) shielding the first and second printed circuit boards with a non-solder-wettable shield having an aperture therethrough, such that substantially only the first edge and portions of the first and second circuit boards immediately adjacent the first edge are exposed through the aperture; and (c) introducing molten solder through the aperture proximate the first edge of the first printed circuit board by wave soldering, so as to urge capillation of the molten solder between the first and second printed circuit boards; and (d) allowing the molten solder to cool so as to form a plurality of solid solder joints each connecting a respective one of the first plurality of circuit traces with a corresponding one of the second plurality of circuit traces.

16. A method according to claim 15, wherein at least one of the first and second printed circuit boards is a flex circuit.

17. A method according to claim 16, wherein each flex circuit includes a polyester substrate.

18. A method according to claim 15, wherein in said step (a) each of the second plurality of circuit traces has a solder-mask-free portion thereof that is immediately proximate the first edge and is not overlapped by the first printed circuit board.

19. A method according to claim 15, further comprising the step of applying flux to at least one of the first and second pluralities of circuit traces before said step (c).

20. A method according to claim 15, further comprising the step of restraining the first and second printed circuit boards during at least said step (c) so as to prevent the predetermined spacing K from exceeding 0.5 mm during said step (c), while allowing the predetermined spacing K to be greater than 0 mm during said step (c).

21. A method for connecting together first and second printed circuit boards, wherein the first printed circuit board includes a polyester substrate having a first plurality of circuit traces arranged on a first surface thereof and terminating proximate a first edge thereof, and wherein the second printed circuit board has a second plurality of circuit traces corresponding to the first plurality of circuit traces and arranged on a second surface thereof, said method comprising the steps of:

(a) arranging the first and second printed circuit boards generally parallel with one another with the first edge of the first printed circuit board overlapping the second printed circuit board, such that the first and second pluralities of circuit traces are matchingly facing each other and are separated from one another by a predetermined spacing K, wherein $0 \text{ mm} \leq K \leq 0.5 \text{ mm}$, and wherein each of the second plurality of circuit traces has a solder-mask-free portion thereof that is immediately proximate the first edge and is not overlapped by the first printed circuit board;

(b) shielding the first and second printed circuit boards with a non-solder-wettable shield having an aperture therethrough, such that substantially only the first edge and portions of the first and second circuit boards immediately adjacent the first edge are exposed through the aperture; and (c) introducing molten solder proximate the first edge of the first printed circuit board by wave soldering, so as to urge capillation of the molten solder between the first and second printed circuit boards; and (d) allowing the molten solder to cool so as to form a plurality of solid solder joints each connecting a respective one of the first plurality of circuit traces with a corresponding one of the second plurality of circuit traces.

22. A method for connecting together first and second printed circuit boards, wherein the first printed circuit board has a first plurality of circuit traces arranged on a first surface thereof and terminating proximate a first edge thereof, and wherein the second printed circuit board has a second plurality of circuit traces corresponding to the first plurality of circuit traces and arranged on a second surface thereof, said method comprising the steps of:

(a) arranging the first and second printed circuit boards with the first edge of the first printed circuit board overlapping the second printed circuit board, such that the first and second pluralities of circuit traces are matchingly facing each other and are separated from one another by a predetermined space K;

(b) shielding the first and second printed circuit boards with a non-solder-wettable shield having an aperture therethrough, such that substantially only the first edge and portions of the first and second circuit boards immediately adjacent the first edge are exposed through the aperture;

(c) introducing molten solder through the aperture proximate the first edge of the first printed circuit board, so as to urge capillation of the molten solder between the first and second printed circuit boards; and (d) restraining the first circuit board and second circuit board during the step of introducing molten solder to prevent the predetermined spacing K from exceeding a predetermined spacing.

* * * * *